United States Patent [19]

Higgins et al.

[11] Patent Number: 5,450,227
[45] Date of Patent: Sep. 12, 1995

[54] OPTICALLY INJECTION-LOCKED SELF-OSCILLATING DUAL-GATE MESFET MIXER

[75] Inventors: Thomas P. Higgins; Dana J. Sturzebecher, both of Tinton Falls; Roland Cadotte, Jr., Freehold; Arthur Paolella, Howell, all of N.J.

[73] Assignee: The United States of America as represented by the Secretary of the Army, Washington, D.C.

[21] Appl. No.: 56,970

[22] Filed: May 3, 1993

[51] Int. Cl.⁶ .............................................. H04B 10/06
[52] U.S. Cl. ....................................... 359/191; 359/189; 359/187; 331/42; 331/172
[58] Field of Search ............... 359/187, 188, 189, 190, 359/191, 194, 195; 331/37, 42, 116, 117, 55, 172, 173; 455/333, 330

[56] References Cited

U.S. PATENT DOCUMENTS

| | | | |
|---|---|---|---|
| 4,541,122 | 9/1985 | Kimura | 455/236 |
| 4,592,095 | 5/1986 | Ohnishi et al. | 455/333 |
| 4,605,909 | 8/1986 | Tsironis | 455/333 |
| 4,633,188 | 12/1986 | Matsuta | 455/333 |
| 4,658,440 | 4/1987 | Pavio et al. | 455/324 |
| 4,750,217 | 6/1988 | Smith et al. | 359/189 |

OTHER PUBLICATIONS

Birkeland et al, FET–Based Planar Circuits for Quasi--Optical Sources and Transceivers 1981 IEEE.
"12 Ghz Receiver with Self-Oscillating Dual-Gate Mesfet Mixer", by Tsironis, C., Electronics Letters, vol. 17, No. 17, Aug. 20, 1981.
"GaAs FET Applications for Injection-locked Oscillators and Self-Oscillating Mixers", by Jajima, Y., IEEE Transactions on Microwave Theory and Techniques, vol. 27, No. 7, pp. 629–632, Jul. 1979.

Primary Examiner—Leo H. Boudreau
Assistant Examiner—Rafael Bacares
Attorney, Agent, or Firm—Michael Zelenka; James A. Digiorgio

[57] ABSTRACT

A dual-gate self-oscillating mixer FET that is injection-locked from a remote LO frequency source. The dual-gate FET having a feedback circuit connected between the first gate port and the drain port that is tuned so that the FET can oscillate within a frequency range including a predetermined LO frequency. The FET having a remote synchronization circuit electrically connected to the FET first gate port to inject the predetermined LO frequency therein and lock the FET oscillation to that LO. Accordingly, the dual-gate FET mixes RF energy input to the second gate port with the locked LO injected in the first gate port and outputs the desired intermediate frequency through the drain port.

6 Claims, 1 Drawing Sheet

OPTICALLY INJECTION-LOCKED SELF-OSCILLATING DUAL-GATE MESFET MIXER

GOVERNMENT INTEREST

The invention described herein may be manufactured, used and licensed by or for the Government for governmental purposes without the payment to me of any royalty thereon.

BACKGROUND OF THE INVENTION

The present invention relates to the field of microwave circuits and fiber optics. More specifically, it relates to injecting a microwave local oscillator (LO) signal into a dual-gate MESFET oscillator circuit from a remote source to create a dual-gate, injection-locked, self-oscillating mixer (SOM).

Currently, FETs are widely used in constructing receiver front-ends. In the past, FET receiver front-ends generally required three FET's to perform three functions (or stages): (1) a preamplifier, (2) a local oscillator and (3) a mixer. It has been shown, however, in an article entitled "12 Ghz Receiver with Self-Oscillating Dual-Gate Mesfet Mixer" by Tsironis, C , published in Electronics Letters, Vol. 17, No. 17, 20th August 1981, that one dual-gate GaAs FET can be configured to provide both the local oscillator and the mixer functions of such devices. A receiver utilizing a dual-gate FET could economize the overall receiver architecture and thus improve its overall performance. In particular, such architecture would reduce the overall conversion loss (IF power/RF power) and noise figure (S/N out/S/N in) of the receiver.

There are, however, some big disadvantages to utilizing such dual-gate self-oscillating mixers in receiver front-ends. For one, receiver performance can be greatly diminished when operating under adverse environmental conditions such as extreme temperature or vibration. This is mainly due to the fact that the receiver LO is local to the receiver, and thus directly subjected to the adverse conditions. Such adverse conditions cause the LO source to become unstable which, in turn, causes the mixer and ultimately the receiver to become unstable.

Another disadvantage, is the inability to synchronize an array of receivers utilizing such dual-gate FET's to the same LO frequency. Since each receiver front end has its own LO, it is impossible to synchronize and tune each to the same frequency.

It has been shown, however, in an article entitled "GaAs FET Applications for Injection-Locked Oscillators and Self-Oscillating Mixers" by Tajima, Y, published in IEEE Transactions on Microwave Theory and Techniques, Vol. 27 no. 7, pp. 629–632, July 1979, that injection-locking can solve these problems associated with dual-gate FETs having a local LO.

Essentially, injection-locking is forcing an FET to oscillate at a desired frequency. In the above disclosure, injection-locking is achieved by feeding electrical energy at a predetermined LO frequency into a single-gate FET that is electrically tuned through a feedback element between its drain and gate port to oscillate at a predetermined frequency. Feeding the electrical energy at the predetermined LO essentially locks the single-gate FET to that predetermined frequency. As such, the single gate FET provides a stable LO frequency source to the mixer stage.

There are many other benefits and advantages to those who utilize injection locking in receiver front-ends. One advantage is that injection-locked FETs can be synchronized to a remote LO source. This provides the ability for an array of receivers to be synchronized to the same frequency. In addition, this eliminates the threat of any adverse environmental effects on the LO and/or the receiver.

A big disadvantage, however, is that receivers utilizing the single-gate injection-locked LO source disclosed above would require an additional FET stage to perform the mixer function. In other words, such receivers would not enjoy the benefits of those utilizing a dual-gate SOM (also described above). Particularly, receivers utilizing the single-gate injection-locked LO source would not have the low conversion-loss and low noise figure enjoyed by those receivers utilizing the dual-gate SOMs.

Consequently, the need for a dual-gate SOM having remote injection-locking capability has long been recognized by those in the field. Receivers utilizing such a device would have the low conversion loss and low noise figure as well as a stable LO under adverse environmental conditions. Moreover, receivers utilizing such a device could be synchronized to the same LO. The present invention fulfills this need.

SUMMARY OF THE INVENTION

The general purpose of the invention is to provide a self-oscillating mixer that: (1) maintains a stable LO frequency in adverse environmental conditions (i.e.: temperature and vibration), (2) provides for remote synchronization when utilized in a receiver front-end, and (3) provides a low noise figure and conversion loss when utilized in a receiver front-end. To attain this, the present invention contemplates injection-locking a dual-gate SOM at a predetermined LO frequency from a remote LO source (i.e.: a laser).

More specifically, the present invention contemplates a dual-gate Field Effect Transistor having a feedback circuit electrically connected between its first gate and its drain such that it oscillates within a predetermined frequency range (including the desired LO frequency). The FET is configured so that when electrical energy at a predetermined LO frequency is injected into its first gate, it becomes injection-locked to that frequency. Moreover, the FET is configured such that the predetermined LO can be injected to its first gate from a remote source through a remote synchronization circuit.

The second gate, drain port and source port of the FET are configured to perform the desired mixing function. Specifically, these ports are configured so that an RF signal input to the second gate mixes with the LO and is output through the drain port at a predetermined intermediate frequency.

The exact nature of this invention, as well as other objects and advantages thereof, will be readily apparent from consideration of the following specification relating to the annexed drawing.

DETAILED DESCRIPTION OF THE PREFERRED EMBODIMENT

Figure 1:
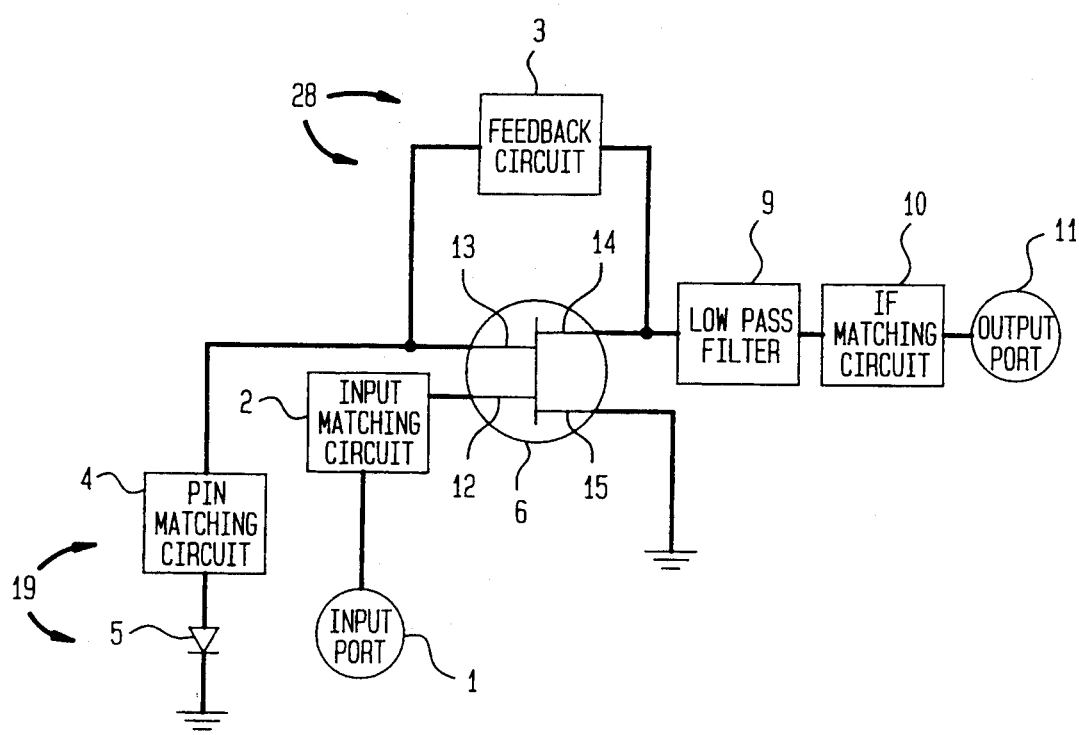
FIG. 1 is a circuit diagram of a preferred embodiment of the invention showing a dual-gate self-oscillating mixer optically injection-locked through a remote local oscillator source.

Referring now to the drawings, there is shown in FIG. 1, a circuit diagram of the preferred embodiment. As shown, dual-gate transistor 6 has first gate 13, second gate 12, source port 15 and drain port 14. Feedback circuit 3 is electrically connected between drain port 14 and first gate 13. First gate 13 is electrically terminated by remote synchronization circuit 19 consisting of PIN diode detector 5 and PIN matching circuit 4 which are connected in series therewith. Second gate 12 is electrically connected to input matching/high pass filter circuit 2 which is terminated by RF input port 1. Source Port 15 is electrically connected to ground potential. Drain port 14 is electrically connected to the series combination of low pass filter 9 and IF matching circuit 10. IF matching circuit 10 is terminated by output port 11.

Essentially, feedback circuit 3 creates an instability in FET 6 so that FET 6 can oscillate within a range of frequencies including the predetermined LO frequency. As such, first gate 13 of FET 6 and feedback circuit 3 comprise transistor oscillator 28 which provides the LO for the mixer function. Specifically, when light modulated at the predetermined LO frequency is input to PIN detector 5 from a remote optical source (not shown), PIN 5 injects electrical energy at that LO frequency into first gate 13. This effectively injection-locks transistor oscillator 28 at the predetermined LO frequency.

Consequently, when an RF signal outside the injection-locking frequency range of transistor oscillator 28 is input to port 1, FET 6 outputs electrical energy at a predetermined IF frequency through drain 14 to output port 11. All LO and RF frequency leakage is blocked from output port 11 by filter 9.

Obviously many modifications and variations of the present invention are possible in light of the above teachings. For example, the inventive technique may be readily applied to a variety of FET receiver front ends that utilize a variety of remote LO sources. Those skilled in art will find it obvious, in light of the above teachings, to provide different types of injection-locking circuitry when interfacing the dual-gate FET with such different sources (i.e.: laser transmission through fiber, open air and semiconductor transmission). In addition, unique mixer function circuitry terminating the second gate, source and drain ports may be required for interfacing such dual-gate SOM's with different FET receivers. It is therefore to be understood, that within the scope of the appended claims, the invention may be practiced otherwise than as specifically described.

What is claimed is:

1. A remotely injection-locked self-oscillating mixer, comprising:
    a dual-gate Field-Effect Transistor having a first and a second gate, a drain port and a source port, said source port electrically biased to a predetermined electric potential;
    a feedback circuit electrically connected between said drain port and said first gate of said transistor, said feedback circuit electrically tuned to feed electrical energy within a predetermined frequency range from said drain port back to said first gate so that said dual-gate transistor will oscillate within that predetermined frequency range;
    a remote synchronization circuit electrically connected to said first gate and said feedback circuit, said remote synchronization circuit injecting electrical energy at a predetermined LO frequency into said first gate so that said dual-gate transistor is injection-locked at said predetermined LO frequency, said predetermined LO frequency being generated from an optical energy source;
    an RF input circuit electrically connected to said second gate of said transistor; and
    an output circuit electrically connected to said drain port of said transistor, said output circuit terminated by an output port, said output circuit tuned to pass electrical energy at a predetermined intermediate frequency from said drain port to said output port.

2. The mixer of claim 1 wherein said remote synchronization circuit comprises a PIN diode detector and a matching circuit, said PIN diode detects light modulated at said predetermined LO frequency and electrically injects electrical energy at said predetermined LO frequency to said first gate for injection-locking.

3. The mixer of claim 2 wherein said remote synchronization circuit further comprises a laser source and a fiber optic cable for providing said light modulated at said predetermined frequency to said PIN detector.

4. The mixer of claim 1 wherein said source port is electrically connected to ground potential.

5. The mixer of claim 1 wherein said RF Input circuit further comprises an input signal matching circuit and an RF matching filter.

6. The mixer of claim 1 wherein said output circuit further comprises a low pass filter and an IF matching circuit to maximize the passing of said electrical energy at said predetermined intermediate frequency from said drain port to said output port.

* * * * *